(12) United States Patent
Inoue

(10) Patent No.: US 7,256,345 B2
(45) Date of Patent: Aug. 14, 2007

(54) CABLE AND MANUFACTURING METHOD THEREFOR

(75) Inventor: Shuichi Inoue, Nishikamo-gun (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/572,952

(22) PCT Filed: Sep. 28, 2004

(86) PCT No.: PCT/JP2004/014165

§ 371 (c)(1),
(2), (4) Date: Mar. 21, 2006

(87) PCT Pub. No.: WO2005/034146

PCT Pub. Date: Apr. 14, 2005

(65) Prior Publication Data

US 2006/0283616 A1    Dec. 21, 2006

(51) Int. Cl.
*H01B 7/00* (2006.01)
*H01B 7/34* (2006.01)

(52) U.S. Cl. ............... 174/36; 174/110 R; 174/117 F; 174/117 FF

(58) Field of Classification Search ............... 174/36, 174/110 R, 117 R, 117 F, 117 FF, 262–266, 174/254, 268; 439/67, 77, 86, 497
See application file for complete search history.

(56) References Cited

U.S. PATENT DOCUMENTS

| | | | | | |
|---|---|---|---|---|---|
| 3,244,795 | A | * | 4/1966 | Latimer | 174/259 |
| 3,296,365 | A | * | 1/1967 | Basile | 174/117 FF |
| 3,459,879 | A | * | 8/1969 | Gerpheide | 174/117 FF |
| 3,459,880 | A | * | 8/1969 | Erdle | 174/117 FF |
| 3,547,718 | A | * | 12/1970 | Herman | 156/55 |
| 3,612,744 | A | * | 10/1971 | Thomas | 174/38 |
| 3,703,604 | A | * | 11/1972 | Henschen et al. | 174/75 R |
| 3,805,213 | A | * | 4/1974 | Austin | 439/77 |
| 3,818,122 | A | * | 6/1974 | Luetzow | 174/86 |
| 3,878,341 | A | * | 4/1975 | Balde | 307/113 |
| 4,113,981 | A | * | 9/1978 | Fujita et al. | 174/88 R |
| 4,149,026 | A | * | 4/1979 | Fritz et al. | 174/32 |
| 4,243,455 | A | * | 1/1981 | Shiba et al. | 156/187 |
| 4,255,853 | A | * | 3/1981 | Campillo et al. | 29/843 |

(Continued)

FOREIGN PATENT DOCUMENTS

JP    60-175315 A    9/1985

(Continued)

OTHER PUBLICATIONS

International Search Report (Jan. 2004).

*Primary Examiner*—William H. Mayo, III
(74) *Attorney, Agent, or Firm*—Rader, Fishman & Grauer PLLC

(57) ABSTRACT

A cable 1 is configured of connecting portions 12 on both ends for connecting to external connecting terminals and an intermediate portion 13. Each connecting portion 12 has electroconductive portions 14 for connecting with external connecting terminals. The cable 1 is formed by layering multiple elastomer sheets 1H. Each elastomer sheet 1H is formed with an elastomer raw material having no electroconductivity as a base, with rectangular elastomer regions 1T having electroconductivity on both ends and transmission paths for connecting the rectangular elastomer regions 1T on both ends.

7 Claims, 7 Drawing Sheets

U.S. PATENT DOCUMENTS

| | | | | |
|---|---|---|---|---|
| 4,578,529 A | * | 3/1986 | Look | 174/117 FF |
| 4,616,717 A | * | 10/1986 | Luetzow | 174/117 F |
| 4,642,421 A | * | 2/1987 | Dery et al. | 174/88 R |
| 4,808,773 A | * | 2/1989 | Crandall | 174/113 R |
| 4,845,315 A | * | 7/1989 | Stopper | 361/827 |
| 5,083,238 A | * | 1/1992 | Bousman | 361/788 |
| 5,134,252 A | * | 7/1992 | Himeno et al. | 174/268 |
| 5,186,632 A | * | 2/1993 | Horton et al. | 439/67 |
| 5,274,195 A | * | 12/1993 | Murphy et al. | 174/117 FF |
| 5,373,109 A | * | 12/1994 | Argyrakis et al. | 174/117 FF |
| 5,541,369 A | * | 7/1996 | Tahara et al. | 174/268 |
| 6,344,616 B1 | * | 2/2002 | Yokokawa | 174/117 F |
| 6,469,252 B1 | * | 10/2002 | Tanaka et al. | 174/117 F |
| 6,492,595 B2 | * | 12/2002 | Sexton | 174/117 F |
| 6,723,925 B2 | * | 4/2004 | Ohara et al. | 174/113 R |
| 6,774,971 B2 | * | 8/2004 | Shirato et al. | 349/150 |
| 7,038,139 B2 | * | 5/2006 | Kanayama et al. | 174/117 R |
| 2004/0211585 A1 | * | 10/2004 | Jordan | 174/117 FF |

FOREIGN PATENT DOCUMENTS

| | | |
|---|---|---|
| JP | 09-120850 A | 5/1997 |
| JP | 2000-322950 A | 11/2000 |
| JP | 2000-340037 A | 12/2000 |
| JP | 2003-272730 A1 | 9/2003 |

* cited by examiner

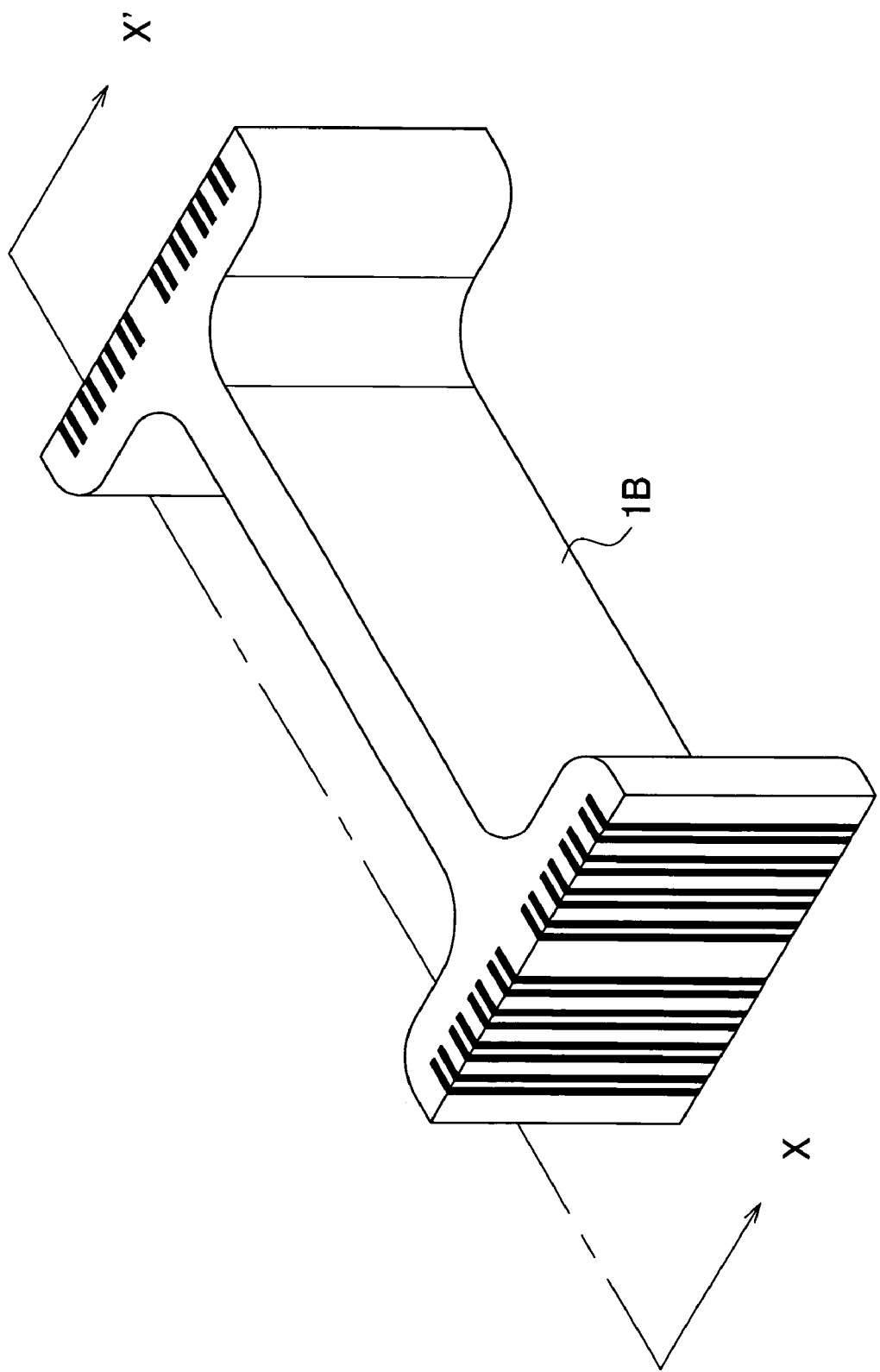

CABLE AND MANUFACTURING METHOD THEREFOR

TECHNICAL FIELD

The present invention relates to an anisotropic electroconductive sheet cable and to a manufacturing method therefor. In particular, the present invention relates to a flexible cable which has an anisotropic electroconductive connecting portion and is configured of elastomer sheet and a manufacturing method thereof.

BACKGROUND ART

As reduction in size and thickness of electronic devices has advanced recently, there is increased need to connect minute circuits with one another, and to connect minute parts and minute circuits, etc. For example, there is a method in which an anisotropic electroconductive elastomer sheet is introduced between electronic parts and printed wiring boards to realize conduction.

Anisotropic electroconductive elastomer sheets are sheets of elastomer having electroconductivity only in a particular direction, and ensure electroconductivity only in the direction intended from the anisotropy thereof. Elastomer sheets generally include those with electroconductivity only in the thickness direction, those which exhibit electroconductivity in the thickness direction when pressure is applied in the thickness direction.

Conventionally, such anisotropic electroconductive elastomer sheets are formed by first forming an anisotropic electroconductive block by integrating arrayed metal fine wires with an insulator such as rubber or the like, and then finely cutting in the direction orthogonal to the direction in which the fine metal wires extend (e.g., Patent Document 1).

Also, as for a method for connecting signal lines of printed wiring boards disposed away from each other with a flexible connecting member, a method using flexible printed wiring boards is known. For example, connecting rigid printed wiring boards with a flexible printed wiring board enables signal lines between the rigid printed wiring boards to be connected while keeping the signal transmission path flexible. With this method, rigid printed wiring boards are formed in multiple layers to reduce the size of the printed wiring boards and to realize increased installation density of electronic circuits, so multi-layer flexible printed boards are also used for the flexible printed wiring boards serving as the connecting member.

Patent Document 1 Japanese Unexamined Patent Application, First Publication No. 2000-340037

DISCLOSURE OF THE INVENTION

Problems to be Solved by the Invention

Conventional anisotropic electroconductive elastomer sheets have electroconductivity in the thickness direction of the sheets placed between the electronic parts and printed wiring boards, and are not intended to realize three-dimensional connection with flexibility between printed wiring boards separated by a certain distance or more. Also, in the event of forming transmission paths on conventional elastomer sheets, the transmission paths are formed on a single plane, so forming all the transmission paths necessary for connecting transmission paths of printed wiring boards requires a wide article.

On the other hand, with multi-layer print boards, there is a known method in which three-dimensional connection is realized by forming via holes through insulating layers. However, there is a problem with this method in that vertical signal reflection occurs, and furthermore, in that this cannot provide equivalency in the vertical direction. Also, there is a method for attaching connectors to printed wiring boards, and connecting cables for parallel transmission, thereby ensuring the transmission paths. However, this method does not provide flexible connection between printed wiring boards.

It is an object of the present invention to provide a cable which has anisotropic electroconductivity for being connected with external connecting terminals such as plug pins, thereby enabling realization three-dimensionally flexible connection between printed wiring boards separated one from another. Another object is to realize reduced area of the cable transmission paths while maintaining parallel transmission.

Means for Solving the Problems

In order to realize the above objects, the present inventor has invented a new anisotropic electroconductive cable, and a manufacturing method thereof.

(1) A cable, having connecting portions to which external terminals are connected and which are provided on both ends, and an intermediate portion connecting these connecting portions to each other, the cable including a plurality of elastomer sheets having non-electroconductivity; in which each of the elastomer sheets has a pair of wide ends, and a narrow intermediate portion provided between the ends, with m rows of rectangular elastomer regions having electroconductivity being arrayed on each of the pair of the wide ends and k patterns (in which k is a number equal to or less than m) of transmission paths connecting the rectangular elastomer regions being formed at the narrow intermediate portion; and in which n layers (in which n is a number equal to or less than m) of the plurality of elastomer sheets are layered such that the rectangular elastomer regions of the upper and lower layers are mutually in contact, and connected with the external connecting terminals by pressuring the external connecting terminals against both ends of the elastomer sheets which have been layered.

(2) A cable according to (1) is capable of flexible bending.

(3) A manufacturing method for a cable including: an electroconductive portion formation step for providing electroconductive elastomer on a non-electroconductive elastomer member formed in the shape of the cable so as to obtain an elastomer member; a cutting step for cutting the elastomer member into sheets to obtain elastomer sheets; a transmission path formation step for forming transmission paths on the surface of the elastomer sheets; and a sheet layering step for layering and adhering the plurality of elastomer sheets.

The present invention provides: a cable which has a structure in which elastomer sheets are layered, and which includes an intermediate portion where flexibility and narrowness have been realized, and connecting portions which has anisotropic electroconductivity and which facilitates attaching and detaching to and from external connecting terminals; and a manufacturing method thereof.

The term "wide ends" may mean that an elastomer sheet has a pair of ends facing each other, and an intermediate portion between these ends, with each of the pair of ends being formed with a larger width than that of the intermediate portion. Also, the wide ends preferably have area wide enough so as to serve as the connecting portions of the cable configured by layering elastomer sheets.

The term "elastomer sheet" means a sheet member fabricated using an elastomer raw material. The term "sheet" means a flat plate of a generally-understood sheet shape. The plate thickness is small, and preferably is as uniform as possible. Normally, the thickness is around 1 mm, but it may be made to have a thickness of approximately 50 µm or less. One feature of the present invention is that, in the event that the thickness of each of the elastomer sheets is small, the thickness of the cable configured by layering these elastomer sheets can be reduced.

The term "elastomer raw material" means a high polymer compound having resilience, and normally is not electroconductive. Examples of elastomer raw material include: natural rubber; polyisoprene rubber, butadiene copolymers and conjugated diene rubber and hydrogenates thereof; block copolymer rubber and hydrogenates thereof; chloroprene polymer; vinyl chloride vinyl acetate copolymer; urethane rubber; polyester rubber; epichlorohydrin rubber; ethylene propylene copolymer rubber; ethylene propylene diene copolymer rubber; soft liquid epoxy rubber; silicone rubber; fluoro rubber; etc. Examples of butadiene copolymer rubber and conjugated diene rubber include: butadiene-styrene; butadiene-acrylonitrile; butadiene-isobutylene; etc. Examples of block copolymer rubber include: styrene-butadiene-diene block copolymer rubber; styrene-isoprene block copolymer; etc. Of these, silicone rubber is preferably employed from the perspective of the excellent heat resistance, low-temperature resistance, chemical resistance, weather resistance, electric insulation, and safety thereof.

The term "electroconductive rectangular elastomer regions" may mean elastomer regions which are electroconductive and disposed in rectangular shapes on an elastomer sheet, and may be elastomer in which a material having electroconductive material is mixed so as to achieve a low specific volume resistance (e.g., $1 \Omega \cdot cm$ or less). Also, the term "rectangular" means an elongated shape, but is not restricted to a rectangular shape as long as matching the shape of the plug pins of the external connecting terminals to which connection is made, and accordingly may be other shapes, such as ellipses or the like.

The term "having electroconductivity" may mean that electroconductivity is sufficiently high. Also, for the overall cable, this means having electroconductivity whereby sufficient electroconductivity can be provided in a particular conducting direction of the cable having this configuration. The electroconductive elastomer is obtained by an electroconductive material such as pure metals; alloys; or non-metal powders (or flakes, chips, foils, or the like) being mixed in an elastomer raw material having no electroconductivity. Examples of pure metals include: gold; silver; copper; nickel; tungsten; platinum; and palladium. Examples of alloys include: stainless steel (SUS); phosphor bronze; beryllium copper; etc. Examples of non-metal electroconductive materials include carbon, etc. The carbon material may include carbon nanotubes, fullerenes, etc.

The phrase "m rows of rectangular elastomer regions being arrayed" may mean that m rows of the rectangular elastomer regions are arrayed in parallel with the external connecting terminal. This "m" is optional, as long as it is an integer of 1 or greater. The array is also optional, and may be irregular or regular. The array intervals may be arbitrary, and may be at equal intervals or the intervals may be different. The rectangular elastomer regions are arrayed as suitable to match the placement and number of plug pins serving as the external connecting terminal to which connection is made.

The phrase "transmission path connecting the rectangular elastomer regions" means a transmission path formed by patterning so as to connect both ends of the rectangular elastomer regions disposed at both ends of the elastomer sheet and facing each other. The transmission path is formed on at least one face of the elastomer sheet, and transmission paths may be formed by patterning on both the front and back sides of the elastomer sheet. Selection of the shape of the transmission path and the rectangular elastomer regions may be optional. The transmission paths may be formed of copper foil, and this copper foil may be plated with gold, nickel, solder, or the like.

The phrase "k patterns (in which k is a number equal to or less than m)" may mean that the number of transmission paths formed on one layer of the elastomer sheet is k which is 1 or greater and which is the same as or less than the number m of rows of rectangular elastomer regions.

Devices such as hybrid ICs and microwave ICs may have clock frequencies as high as 10 GHz, so there are great expectations for capabilities of cables for use of printed wiring boards to be capable of handling high frequencies. Accordingly, an arrangement may be made to handle transmission of high-frequency signals in which two differential signal lines are provided for a single signal, for example. With such an arrangement, signal transmission is performed with low-voltage differential transmission, thereby avoiding the problem of electromagnetic waves being emitted and the problem of skin effect.

The phrase "narrow intermediate portion" may mean that the width of the intermediate portion is narrow than that of the edges on both sides of the elastomer sheet. One feature of the present invention is that the signal paths at the intermediate portion is narrower than both end portions, whereby narrowness and flexibility of the cable can be ensured at the time of using as a connecting cable, and enabling complicated three-dimensional connections.

The phrase "patterns are formed at the intermediate portion" means that transmission paths are formed on at least the intermediate portion of the elastomer sheet, and transmission paths may be formed at both end portions as well, not only the intermediate portion. The term "pattern formation" may mean selectively dissolving the copper foil by etching or the like to form necessary transmission paths. While the wiring patters of the transmission paths are optional, in the embodiment of the present invention, each transmission path is connected one-on-one to the rectangular elastomer region disposed on both ends of the elastomer sheet, and multiple transmission paths on the elastomer sheets intersect three-dimensionally, so as to not short-circuit.

The term "non-electroconductive" may mean sufficiently low electroconductivity, or may mean sufficiently high electric resistance. Also, this may mean overall for the cable that the cable has non-electroconductivity such that sufficient non-electroconductivity can be provided in the non-conducting direction of the anisotropic electroconductive cable with this configuration.

The phrase "such that rectangular elastomer regions of the upper and lower layers are mutually in contact" means that at the time of layering multiple elastomer sheets, the upper and lower layers overlaying each other are in contact, thereby having electroconductivity in the layered direction. The term "contact" means that the elastomer sheets are physically layered and thus secured, and the phrase "such that . . . in contact" is for ensuring electroconductivity of the rectangular elastomer regions in the layered direction.

The phrase "n layers (in which n is a number equal to or less than m) . . . are layered" means that the number n of layers layered is a number equal to or less than the number m of the rows of rectangular elastomer regions arrayed. Here, n is an integer 1 or greater. The term "layering" means binding multiple elastomer sheets. Also, the number of rows m of the rectangular elastomer regions formed on the elastomer sheets may differ from one layer to another.

With the present invention, elastomer sheets are layered, whereby the transmission paths of each layer can transmit signals independently. Accordingly, one of the features thereof is that signals input and output from external connecting terminals can be transmitted and received in parallel. Another feature is that, regardless of being a parallel cable, the intermediate portion of the cable is narrow, due to layering.

The term "external connecting terminal" may be an elastomer connector rather than a plug pin. Examples of elastomer connectors which can be used include connectors of the type in which elastomer such as electroconductive rubber or the like is used and electrical connection is realized simply by inserting between electrodes and pressing, and anisotropic electroconductive sheet-type elastomer connectors which insulate in the horizontal direction and conduct in the vertical direction.

The term "anisotropic electroconductivity" means having electroconductivity in only one direction. Anisotropic electroconductivity in an anisotropic electroconductive cable means overall having electroconductivity only in the layered direction of the elastomer sheets due to the rectangular elastomer regions making up the conducting portions of the cable, and not having electroconductivity in the planar direction of the elastomer sheets.

The term "anisotropic electroconductive sheet" may be a flexible anisotropic electroconductive sheet having a predetermined thickness, and a predetermined front face and back face on the front and behind of this thickness. The term "having a predetermined thickness, and a predetermined front face and back face on the front and behind of this thickness" may be features of a normal sheet. This anisotropic electroconductive sheet may have a certain thickness, and a front face and back face stipulated to dimensions greater than the thickness in front of and behind the thickness, or above and below. The term "flexibility" may mean that the sheet is capable of flexing.

The phrase "capable of flexible bending" is a property which normal cables have and includes not only bending at the intermediate portion of the anisotropic electroconductive cable, but also includes deformation capabilities such as curving, bending into a U-shape, twisting, etc.

The shape of the anisotropic electroconductive cable is an optional shape having a pair of connecting portions for connection with external connecting terminals and an intermediate portion between these connecting portions. It is sufficient that the intermediate portion serving as the transmission paths of the cable is narrower than the connecting portions provided on both ends of the cable, so the intermediate portion does not need to be positioned at the center in the width direction of the connecting portions, and may be lopsided toward one edge in the width direction.

The phrase "electroconductive portion formation step" means a step for adhering electroconductive elastomer to a non-electroconductive member of an elastomer sheet formed in the shape of the cable. The term "cutting step" means a step for cutting the elastomer member in which the electroconductive elastomer which has been adhered to the non-electroconductive member is cut into sheets. The term "transmission path formation step" means a step for forming one or more transmission paths connecting the rectangular elastomer regions at both ends on the elastomer sheet. The term "sheet layering step" means a step for forming the anisotropic electroconductive sheet cable by layering the multiple elastomer sheets upon which the transmission paths have been formed.

Advantages

The present invention provides a cable for connecting external connecting terminals such as printed wiring boards and the like, and has the advantage of functioning as a flexible cable in which reduction in width and thickness has been realized. The connecting portions of the cable have anisotropic electroconductivity, with advantages of the connection to connectors being facilitated due to the resilience of the elastomer, and also, the connection being detachable. Also, due to the transmission paths being formed of multiple layers, the advantage of reduction in width of the cable is realized regardless of being a cable capable of parallel transmission and reception of signals, with the capability to three-dimensionally connect between printed wiring boards and the like.

BRIEF DESCRIPTION OF THE DRAWINGS

FIG. 4 is a perspective view illustrating the step for cutting the elastomer member, which is the manufacturing step following FIG. 3.

Figure 1:
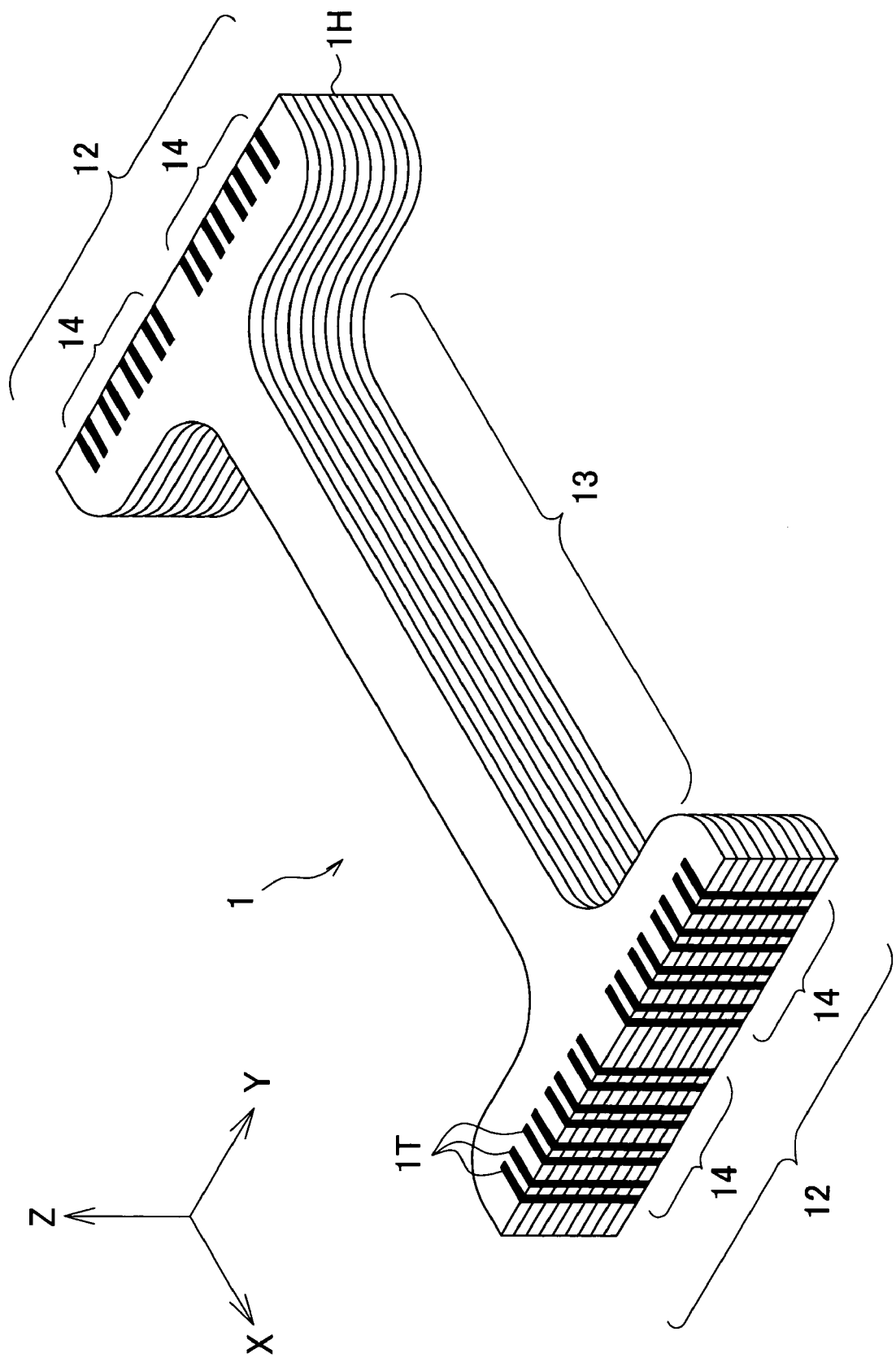
FIG. 1 is an external perspective view of a cable according to an embodiment of the present invention.

REFERENCE NUMERALS 1 cable
12 connecting portion
13 intermediate portion
14 electroconductive portion
1H, 1S through 9S, 2M, 3M, 100S elastomer sheets
1P, 2P, 1P1 through 1P4, 2P1 through 2P4 plug pins
1T, 1L1, 1L2, 1R1 through 1R4, 2L1 through 2L4, 2R1 through 2R4, 3L1 through 3L4, 3R1 through 3R4, 9L1, 9L2 rectangular elastomer regions
2D1, 2D2, 2D1X, 2D2X, 3D1, 3D2 transmission paths

PREFERRED MODE FOR CARRYING OUT THE INVENTION

Now, the present invention will be described in further detail by way of an embodiment of the present invention with reference to the drawings; however, it should be noted that the embodiment only lists specific materials and values as preferred examples of the present invention, and the present invention is not limited to the present embodiment.

FIG. 1 illustrates a perspective view of a cable 1 which is an embodiment of the present invention. The cable 1 according to the present embodiment has a pair of connecting portions 12 formed on both ends thereof for connecting external terminals, and an intermediate portion 13 interposed between the connecting portions 12. With such a structure, the intermediate portion is formed narrower than the connecting portion 12. Electroconductive portions 14 having electroconductivity are provided to the connecting portions 12.

The cable 1 shown in FIG. 1 is formed of multiple layers of elastomer sheets 1H. The elastomer sheets 1H are configured with a non-electroconductive elastomer as an elastomer ingredient. Multiple rectangular elastomer regions 1T having electroconductivity are disposed on both ends of the elastomer sheets 1H. The electroconductive portions 14 are formed by the rectangular elastomer regions 1T provided on each elastomer sheet 1H being layered.

The rectangular elastomer regions 1T have electroconductivity in the front-to-back direction of the elastomer sheets 1H, so electroconductivity between overlaid layers of the elastomer sheets 1H is ensured. Accordingly, the electroconductive portions 14 have electroconductivity in the Z direction which is the direction in which the elastomer sheets are layered. However, these have no electroconductivity in the X and Y directions which are the planar directions of the elastomer sheets 1H, and accordingly the electroconductive portions 14 have anisotropic electroconductivity.

For the elastomer raw material, silicone rubber manufactured by Mitsubishi Plastics, Inc., silicone rubber manufactured by Shin-Etsu Polymer Co., Ltd., or the like, is used. The electroconductive portions 14 having electroconductivity is formed of a material in which silver (Ag) fine particles have been kneaded into silicone rubber.

With the embodiment shown in FIG. 1, nine layers of the elastomer sheets 1H have been layered, but the number of layers to be layered is optional, and can be adjusted according to the external connecting terminals connected thereto and the electroconductive portions 14 of the cable. Now, in the event of differentiating each of the nine elastomer sheets 1H, one outermost layer (top layer) elastomer sheet will be indicated by 1S, the elastomer sheet below that by 2S, and so on through the other outermost layer (bottom layer) elastomer sheet which is 9S.

With the embodiment shown in FIG. 1, the electroconductive portion 14 is formed of 16 rows of rectangular elastomer regions 1T with two adjacent rectangular elastomer regions 1T forming pairs, such that four pairs of rectangular elastomer regions 1T containing eight rectangular elastomer regions 1T form one group, and two of these groups are provided. This is one example, and the pair configuration, group configuration, and total number of electroconductive portions 14 are optional. Selection of these can be adjusted corresponding to the external connecting terminals to be connected, and the number of layers of the elastomer sheets 1H. Note that while in FIG. 1 all of the elastomer sheets H have 16 rows of rectangular elastomer regions 1T, thereby configuring 16 electroconductive portions, the number of rectangular elastomer regions 1T may change from one layer to another.

Figure 2:
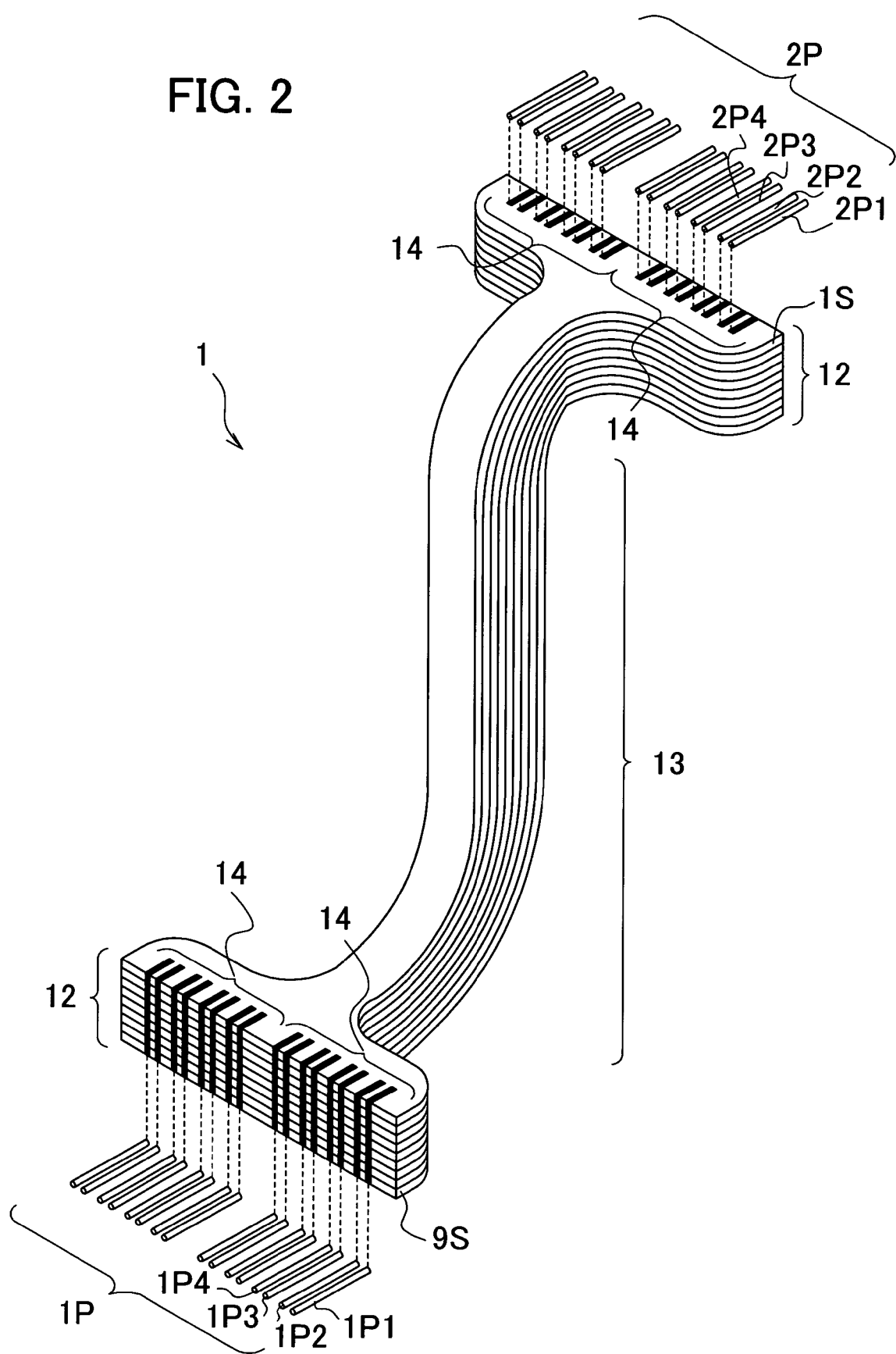
FIG. 2 is a perspective view illustrating a connection example between the cable shown in FIG. 1 and an external connecting terminal.

FIG. 2 is an example of an embodiment for connecting external terminals using the cable 1. Plug pins 1P of an external connecting terminal, and plug pins 2P of an external connecting terminal which is at a position three-dimensionally distanced from the plug pins 1P (i.e., disposed facing the plug pins 1P across the cable 1), are connected by the cable 1. The cable 1 is configured of elastomer sheets 1H and is flexible. This provides flexible connection between the plug pins 1P and the plug pins 2P disposed facing one another through the intermediate portion 13 of the cable 1. While the external connecting terminals shown in FIG. 2 are plug pins, elastomer connectors may be used instead.

Elastomer connectors are configured using elastomer such as electroconductive rubber or the like, and are connectors which are electrically connected simply be placing between terminals and pressing. As for elastomer connectors, there are anisotropic electroconductive sheet-type elastomer connectors which are insulating in the horizontal directions and electroconductive in the vertical direction.

With the connection portions 12 of the cable 1, the plug pins 1P are connected to the rectangular elastomer regions 1T of the elastomer sheet 9S which is the bottom layer. In the same way, the plug pins 2P of the external connecting terminals and the connecting portion of the cable 1 are connected by the plug pins 2P and the rectangular elastomer regions of the topmost layer being connected. Accordingly, the electroconductive portions 14 have electroconductivity only in the layered direction, so the electrical connection of the plug pins 1P and the plug pins 2P can conduct only in the layered direction of the connecting portions 12. With the present embodiment, transmission paths are provided to each elastomer sheet 2S through 9 for connecting the rectangular elastomer regions 1T formed on both ends thereof facing one another across the intermediate portions, except for the elastomer sheet 1S layered as the top layer. Therefore, it is possible to transmit signals in parallel transmission system.

Next, a method for manufacturing the cable 1 shown in FIG. 1 will be described with reference to FIG. 3A through FIG. 6. Note that from FIG. 3A on, the rectangular elastomer regions denoted with reference symbol 1T in FIG. 1 will be described with different symbols, to differentiate those formed on each layer of the elastomer sheets 1S through 9S.

Figure 3A:
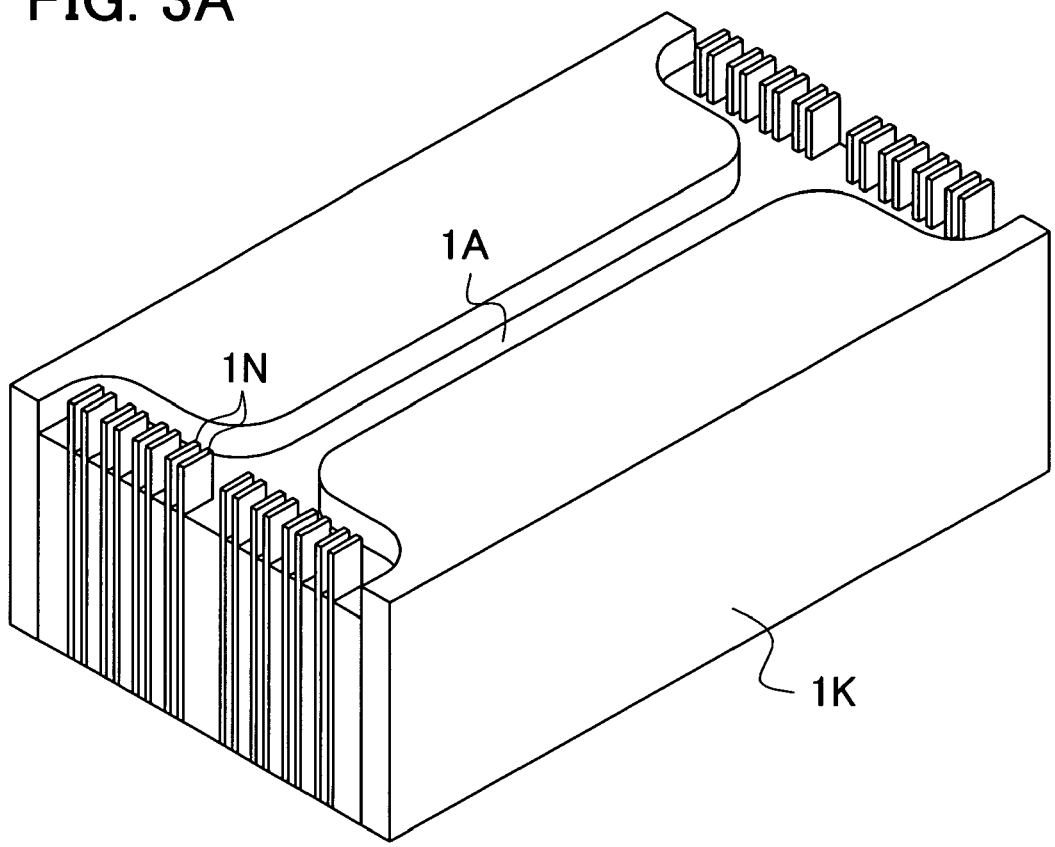
FIG. 3A is a perspective view illustrating the manufacturing method of the cable shown in FIG. 1.
Figure 3B:
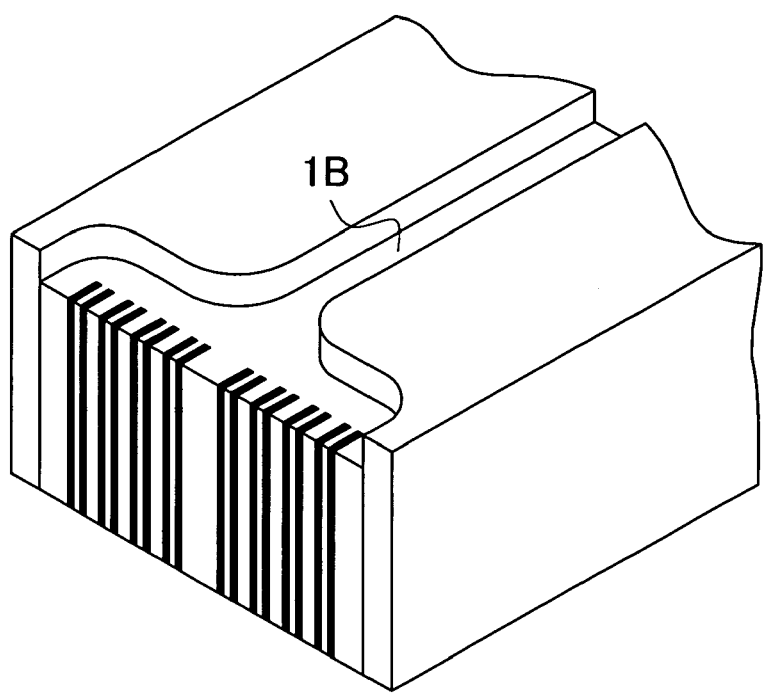
FIG. 3B is a perspective view illustrating the manufacturing method of the cable shown in FIG. 1.

First, the electrode formation processing will be described. In FIG. 3A, multiple cores 1N are erected on both ends of a cable mold 1K from which the shape of the completed cable has been punched out. Non-electroconductive rubber, employed as an elastomer material, is placed in this mold and formed. Furthermore, vulcanization and heating are performed, thereby yielding a non-electroconductive elastomer member 1A which has no electroconductivity. Next, as shown in FIG. 3B, the cores 1N are removed, and a non-vulcanized electroconductive rubber, into which an electroconductive substance such as silver has been kneaded, is poured into the vacated portions. Subsequently, heating is performed so as to bond the non-vulcanized electroconductive rubber with the vulcanized non-electroconductive rubber, thereby yielding an elastomer member 1B.

Next, the elastomer member 1B is removed from the mold by cutting, and elastomer sheets 100S are obtained by cutting the elastomer member 1B into sheets along the X-X' cutting line as shown in FIG. 4. The thickness of the elastomer sheets can be adjusted as desired. Normally, this is around 1 mm, but can be made as thin as approximately 100 μm or thinner (even 50 μm or less if particularly desired), or can be several mm. The thickness in the present embodiment is approximately 1 mm.

Cutting can be performed with blades such as with a super steel cutter or ceramic cutter, stones such as with a fine cutter, cutting with saws, or cutting with other cutting equipment or cutting tools (which may include non-contact cutting devices such as laser cutters). Also, cutting fluid such as cutting oil may be used in the cutting process to prevent overheating, to obtain a clean cutting face, or for other objects, or, cutting may be performed dry.

Figure 5B:
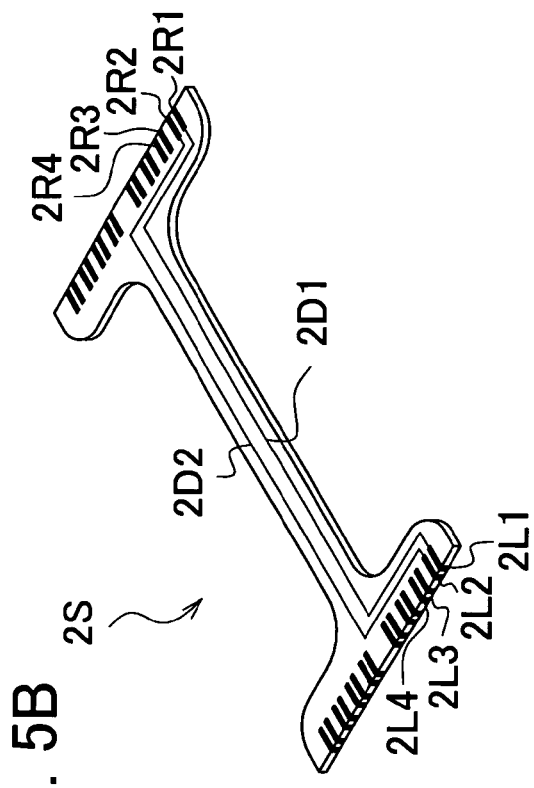
FIG. 5B is a perspective view illustrating an elastomer sheet on which transmission paths have been formed.
Figure 5C:
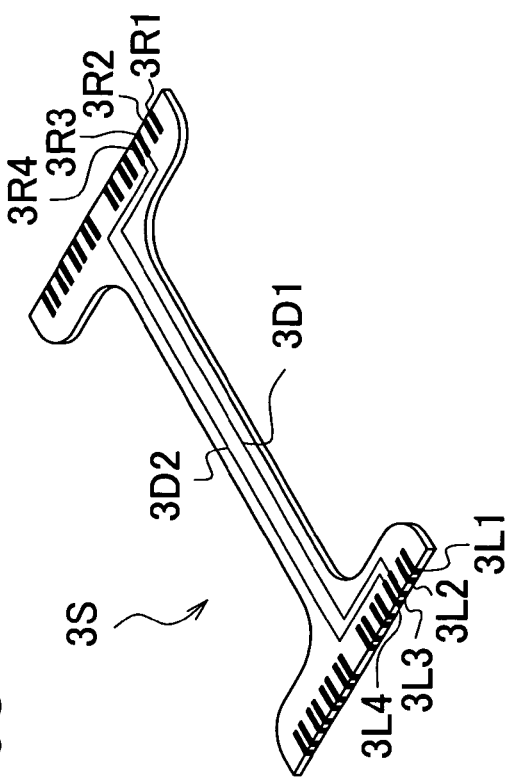
FIG. 5C is a perspective view illustrating an elastomer sheet on which transmission paths have been formed.
Figure 5A:
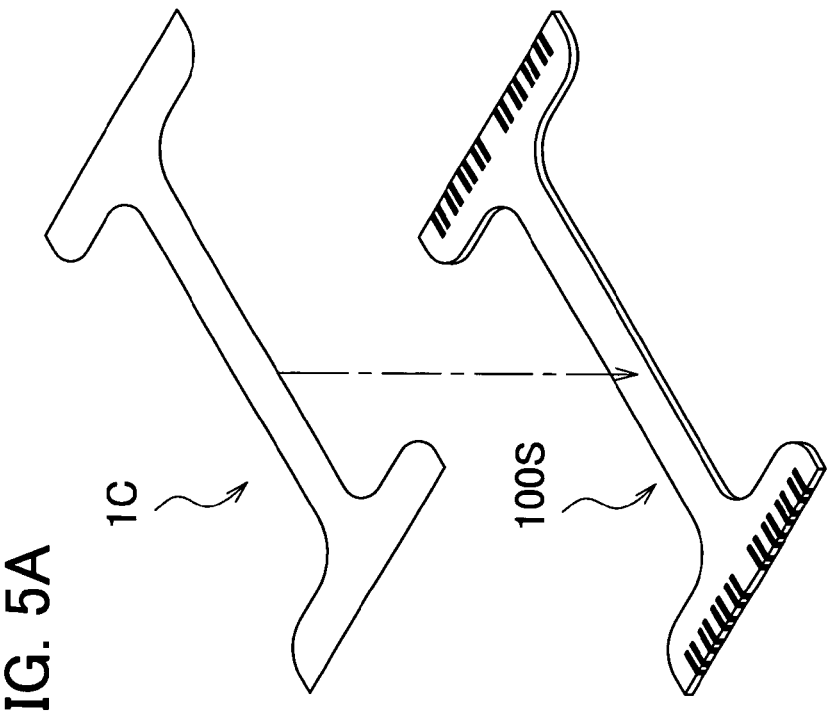
FIG. 5A is a perspective view illustrating the step for forming transmission paths on the elastomer sheet, which is the manufacturing step following FIG. 4.

In the transmission path formation processing, a copper foil 1C having the same shape as the elastomer sheet 100S is adhered onto the elastomer sheet 100S, as shown in FIG. 5A. Next, transmission paths are formed by performing photoetching for the elastomer sheet 100S, on which the copper foil 1C has been adhered. As a mask pattern, a photomask is used in which are formed desired transmission paths for connecting the rectangular elastomer regions on both end thereof.

FIG. 5B illustrates an elastomer sheet 2S upon which has been formed transmission paths 2D1 and 2D2. The transmission path 2D1 connecting the rectangular elastomer region 2L1 and rectangular elastomer region 2R1 and the transmission path 2D2 connecting the rectangular elastomer region 2L2 and rectangular elastomer region 2R2 are formed on the elastomer sheet 2S. In the same way, in FIG. 5C, a transmission path 3D1 connecting the rectangular elastomer region 3L3 and rectangular elastomer region 3R3 and a transmission path 3D2 connecting the rectangular elastomer region 3L4 and rectangular elastomer region 3R4 are formed on an elastomer sheet 3S. Thus, elastomer sheets upon which transmission paths are formed are fabricated of a number corresponding to the number of transmission paths which is desired.

The transmission patterns shown in FIG. 5B and FIG. 5C are but an example. As for other patterns, for example, one or three or more transmission paths may be formed on a single elastomer sheet. Also, the transmission path on the elastomer sheet 2S may connect between desired rectangular elastomer regions selected from the rectangular elastomer region 2L1 up to the rectangular elastomer region 2R3, for example. These transmission path patterns are determined according to which of the plug pins are going to be connected at the ends where the sheet cable is connected.

Figure 6:
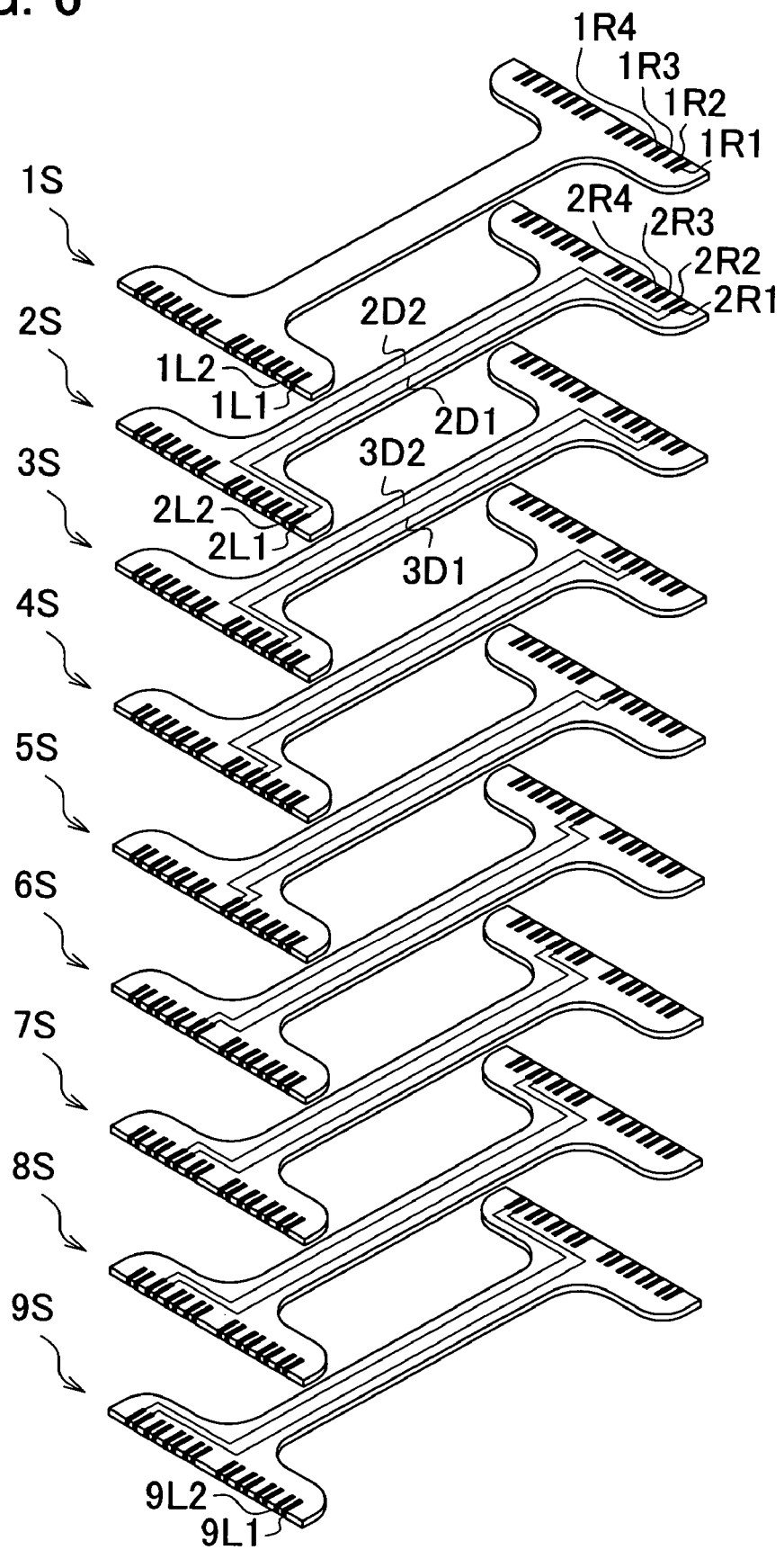
FIG. 6 is a perspective view illustrating the step for layering elastomer sheets, which is the manufacturing step following FIG. 5A.

FIG. 6 illustrates a sheet layering processing for layering the nine elastomer sheets 1S through 9S to form a cable. As shown in the drawing, the elastomer sheet 1S through elastomer sheet 9S are layered. Now, the elastomer sheet 1S which has no transmission path is provided on the topmost layer. This prevents the transmission path of the elastomer sheet 2S, which is layered on the elastomer sheet 1S serving as the top layer, from being exposed, and for ensuring insulation.

Next, the operations of the present invention will be described. An example in which the cable 1 formed by layering the multiple elastomer sheets 1S through 9S is connected to the plug pins 1P and plug pins 2P, which are external connecting terminals shown in FIG. 2, will be described. Upon the cable 1 being connected to the plug pin 1P side, the elastomer sheet 9S which is the bottom layer of the cable 1 is pressed into contact with the plug pins 1P. At the plug pin 2P side, the elastomer sheet 1S which is the top layer of the sheet cable 1 is pressed into contact with the plug pins 2P.

At the plug pin 1P side, the rectangular elastomer region 9L1 of the elastomer sheet 9S comes into contact with the plug pin 1P1, and the rectangular elastomer region 9L2 comes into contact with the plug pin 1P2. Now, the electroconductive portions 14 have electroconductivity only in the layered direction due to the anisotropic electroconductivity thereof, so conductive paths are ensured from the rectangular elastomer region 9L1 to the rectangular elastomer region 1L1, and from the rectangular elastomer region 9L2 to the rectangular elastomer region 1L2.

Regarding conduction in the layered direction from the rectangular elastomer region 9L1, only the rectangular elastomer region 2L1 which has the transmission path 2D1 on the elastomer sheet 2S is not an unwired terminal. Accordingly, electricity from the plug pin 1P1 passes through the rectangular elastomer region 9L1 and rectangular elastomer region 2L1, reaches the rectangular elastomer region 2R1, and passes through the rectangular elastomer region 1R1 due to the anisotropic electroconductivity of the electroconductive portion 14, and reaches the plug pin 2P1.

Also, from the plug pin 1P2, electricity passes through the rectangular elastomer region 9L2 and rectangular elastomer region 2L2, reaches the rectangular elastomer region 2R2, and passes through the rectangular elastomer region 1R2 due to the anisotropic electroconductivity of the electroconductive portion 14, and reaches the plug pin 2P2. Accordingly, with the sheet cable shown in FIG. 6, a parallel path is realized in which the electroconductive path between the plug pin 1P1 and the plug pin 2P1 is secured, and the electroconductive path between the plug pin 1P2 and the plug pin 2P2 is secured.

Figure 7:
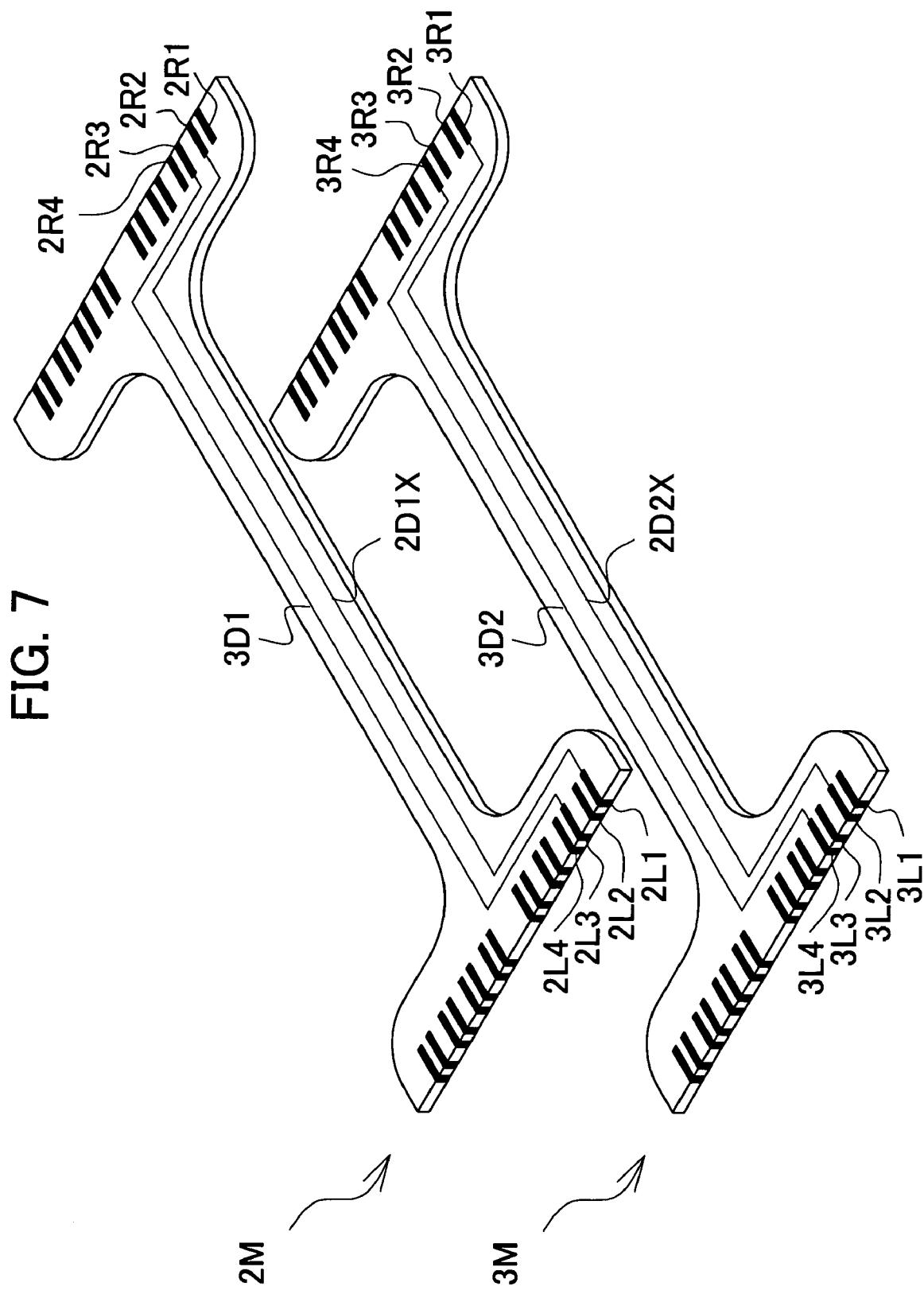
FIG. 7 is a perspective view of an elastomer sheet according to another embodiment of that shown in FIG. 6.

FIG. 7 illustrates an example of an elastomer sheet 2M and an elastomer sheet 3M used for a sheet cable having a three-dimensional intersecting path. The wiring patterns of the transmission paths intersect three-dimensionally. The elastomer sheet 2M has a transmission path 2D1X connecting the rectangular elastomer region 2L1 and the rectangular elastomer region 2R2, and a transmission path 3D1 which is the same path as with the elastomer sheet 3S. The elastomer sheet 3M has a transmission path 2D2X connecting the rectangular elastomer region 3L2 and the rectangular elastomer region 3R1, and a transmission path 3D2 which is the same path as with the elastomer sheet 3S. The elastomer sheet 2S shown in FIG. 6 is replaced with the elastomer sheet 2M shown in FIG. 7, and the elastomer sheet 3S shown in FIG. 6 is replaced with the elastomer sheet 3M shown in FIG. 7. With such an arrangement, a transmission path from the rectangular elastomer region 9L1 to the rectangular elastomer region 1R2 is secured, and a transmission path from the rectangular elastomer region 9L2 to the rectangular elastomer region 1R1 is secured. Other connections are the same as those shown in FIG. 6, so a locally-intersecting sheet cable is obtained.

Conducting paths are not restricted to such parallel paths or three-dimensionally-intersecting paths, and paths can be designed as desired. Freedom of selection of the rectangular elastomer regions for connecting the transmission paths on the elastomer sheets, selection of the transmission path patterns, and selection of the number of transmission paths, provides just that much freedom for conducting paths. One or more transmission paths cannot intersect due to general conducting path formation conditions, so there is the need for forming transmission path patterns using the insulation between layers.

In addition to the freedom of the conducting paths, the number of elastomer sheets to be layered, and the number of the rectangular elastomer regions which the elastomer sheets have, may also be optionally chosen, so various cables can be manufactured to suit the external connecting terminals.

The present invention is used as a cable flexibly connected to external connecting terminals on printed wiring boards and the like, and is capable of parallel signal exchange.

The invention claimed is:

1. A cable, comprising:
   a cable body including a plurality of elastomer sheets having non-electroconductivity, each of said elastomer sheets having a pair of wide ends and a narrow intermediate portion integrally connected to and provided between the ends;
   m rows of rectangular elastomer regions having electroconductivity being arrayed on each of the pair of said wide ends, each one of the rectangular elastomer regions forming a rectangular bar member embedded into a respective leading end portion of the pair of wide ends; and
   k patterns (wherein k is a number equal to or less than m) of transmission paths connecting said rectangular elastomer regions by extending between connected ones of the transmission paths of respective ones of the rectangular elastomer regions through said narrow intermediate portion;
   wherein n layers (wherein n is a number equal to or less than m) of said plurality of elastomer sheets are layered such that the rectangular elastomer regions of the upper and lower layers are mutually in contact, and connected with said external connecting terminals by pressuring said external connecting terminals against both ends of said elastomer sheets which have been layered.

2. A cable according to claim 1, capable of flexible bending.

3. A cable according to claim 1, wherein the transmission paths are parallel in the narrow intermediate portions.

4. A cable according to claim 1, wherein the transmission paths are locally three-dimensionally intersecting.

5. A cable according to claim 1, wherein the elastomer sheet, which has no transmission path, is provided on the topmost layer.

6. A manufacturing method for a cable, comprising:
   an electroconductive portion formation step for providing electroconductive elastomer on a non-electroconductive elastomer member formed in the shape of said cable so as to obtain an elastomer member;
   a cutting step for cutting said elastomer member into sheets to obtain elastomer sheets;
   a transmission path formation step for forming transmission paths on the surface of said elastomer sheets; and
   a sheet layering step for layering and adhering said plurality of elastomer sheets to form a cable body having opposing leading end portions of the non-electroconductive elastomer member with bar-shaped portions of the electroconductive elastomer being embedded into respective ones of the opposing leading end portions.

7. A manufacturing method for a cable, comprising:
   an electroconductive portion formation step for providing a bar-shaped portion of an electroconductive elastomer on a respective leading end portion of a non-electroconductive elastomer member formed in the shape of said cable so as to obtain an elastomer member;
   a cutting step for cutting said elastomer member into sheets to obtain elastomer sheets;
   a transmission path formation step for forming transmission paths between the electroconductive elastomers at leading end portions on the surface of said elastomer sheets; and
   a sheet layering step for layering and adhering said plurality of elastomer sheets such that electroconductive elastomers of the upper and lower layers are in contact.

* * * * *